United States Patent [19]

Thistle et al.

[11] 4,176,297

[45] Nov. 27, 1979

[54] ULTRA VIOLET INITIATED GAS DISCHARGE VISUAL DISPLAY MATRIX

[75] Inventors: William G. Thistle, Manotick; Joseph G. G. Dionne, Loretteville, both of Canada

[73] Assignee: Her Majesty the Queen in right of Canada, as represented by the Minister of National Defence, Ottawa, Canada

[21] Appl. No.: 834,567

[22] Filed: Sep. 19, 1977

[30] Foreign Application Priority Data

Oct. 26, 1976 [CA] Canada .................................. 264198

[51] Int. Cl.[2] ....................... H05B 41/00; H01J 61/02; G11C 11/28

[52] U.S. Cl. .................................... 315/150; 315/153; 315/155; 315/169.4; 340/706; 365/116

[58] Field of Search ............... 315/149, 151, 153, 155, 315/169 R, 169 TV, 150; 340/324 M, 706, 707; 365/116, 234

[56] References Cited

U.S. PATENT DOCUMENTS

| | | | |
|---|---|---|---|
| 2,876,374 | 3/1959 | Riggen | 315/169 TV X |
| 3,800,296 | 3/1974 | Weber | 365/116 X |
| 3,826,949 | 7/1974 | Nakamura et al. | 315/169 R |

OTHER PUBLICATIONS

Zarowin, *U.V. Laser Write-In for Plasma Display Panel*, IBM Technical Disclosure Bulletin, vol. 18, No. 4, Sep. 1975, p. 1248.

*Primary Examiner*—Eugene R. LaRoche
*Attorney, Agent, or Firm*—Nathan Edelberg; Jeremiah G. Murray; Edward Goldberg

[57] ABSTRACT

A large area visual display matrix of ultra-violet initiated individual small gas discharge elements. Each element remains in a discharge condition until the voltage applied to a common anode is turned off and for this reason the matrix requires no associated memory or storage property to remain on as long as information is to be displayed. The matrix generally comprises, in order, an electrically conductive cathode with a low work function material photo-emissive coated thereon which emits electrons when irradiated by U.V. light, an insulating medium with apertures therein, individual anodes with holes therein the holes being axially aligned with the apertures in the insulating medium, a voltage supply for each anode, the foregoing elements being sandwiched between a base and a U.V. permeable cover, and a suitable gas filling for the apertures. A source of U.V. light is directed at the portion of the visual display it is desired to illuminate.

13 Claims, 2 Drawing Figures

ULTRA VIOLET INITIATED GAS DISCHARGE VISUAL DISPLAY MATRIX

This invention relates to a stable large area visual display matrix of ultra-violet (U.V.) initiated plasma discharge elements or cells. The invention has particular, but not exclusive, utility in providing a visual display in a large static command post location.

Several prior art display devices have suffered from one or more of the following deficiencies.

It has been necessary to re-initiate the display element continuously at a rate high enough to maintain the displayed information in the visible state. To do so a memory distinct from the display device had to remain in the ON state for as long as the information had to be displayed. Consequently a high rate of data transfer had to be possible between the display device and the distinct memory.

It has been necessary to initiate the gas discharge in a display cell either by using a separate "Trigger" electrode or by variation of the electrode potentials. These techniques require complex control networks and/or timing systems to determine when a cell will be ON (initiation) and which cell will be ON (addressing). These control systems consume a relatively large portion of the total display power required.

It is a feature of one object of the invention to provide a large area visual display matrix having cells which are addressed by ultra-violet light.

It is a feature of another object of the invention to provide a visual display requiring a low power addressing requirement.

It is a feature of another object of the invention to provide a visual display device having a low data transfer rate between the display device and an associated computer.

It is a feature of another object of the invention to provide a visual display device wherein the sustaining power is obtained from auxiliary means which are distinct from the initiating or triggering energy.

In accordance with the foregoing features, the invention has a display assembly of the type incorporating a matrix of small gas plasma discharge elements, said assembly comprising an electrically conductive cathode with a low work function coating thereon said coating emitting electrons when irradiated with ultra-violet light; an insulating plate, in gas sealing engagement with said coating, said plate having a plurality of cavities formed therein; a plurality of anodes each having an aperture therein axially aligned with an associated cavity; a plurality of electrical resistive means connected on each to said anodes; electrical supply means to apply a dc potential to said anodes through the resistive means associated therewith; a cover member which is transparent to U.V. light and which is in sealing engagement with said insulating plate and enclosing said anodes and said cavities; a mixture of noble gases in each of said cavities; and, U.V. illuminating means aligned with selected cavities and, in use, directing U.V. light through said cover plate into said selected cavities thereby to strike the said cathode and initiate discharge within said cavities and, switch means to disconnect said dc potential from selected anodes.

The invention will now be described with reference to the accompanying drawings in which.

Figures 1, 2:
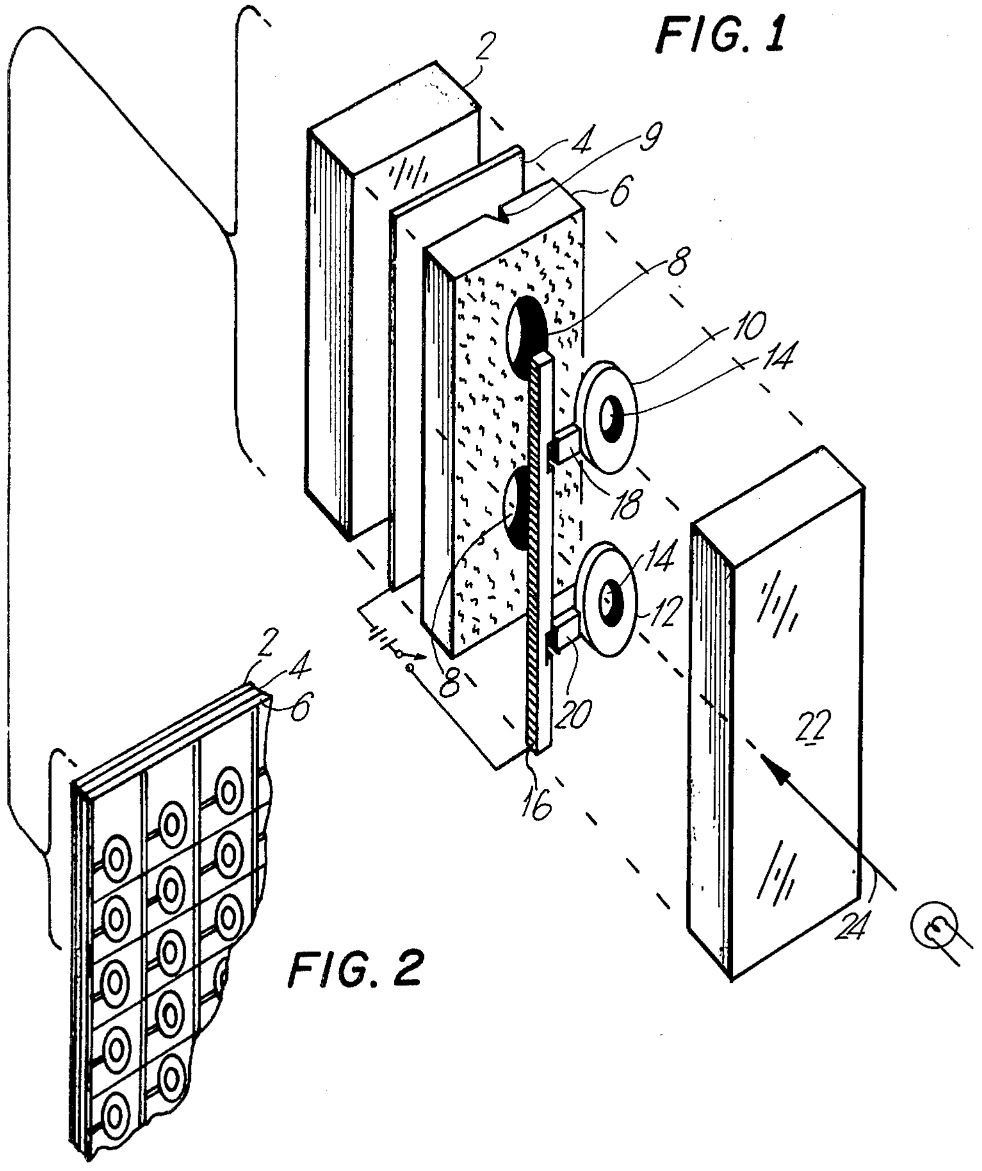
FIG. 1 is an exploded view of a pair of elements in a display device.
FIG. 2 is an isometric view of a part of a display device comprising elements of the type shown in FIG. 1.

Referring now to FIG. 1, there is shown one pair of display elements comprising a glass or ceramic back 2, a cathode 4 with a low work function photoemissive material coating thereon, a glass plate 6 with apertures 8 therein. The plate 6 may be provided with a notch or other suitable channel 9 whereby a connecting path between all the cavities is established whereby the cavities may be filled and each maintained at the same pressure. In juxtaposition with the plate 6 are anodes 10 and 12 having apertures 14 therein. A conductor 16 is connected through a resistive element 18 to anode 10 and through a resistive element 20 to anode 12. The anodes 10, resistors 18 and the conductor 16 could be deposited on the surface of plate 6 by means of photodeposition, evaporation techniques or silk screening. A cover 22, which is made of a material which is permeable to U.V., completes the assembly. The plate 22 could be made of quartz. While it is not essential, the cover plate 22 may be recessed to hold the anodes 10, resistors 20 and the conductors 16. The space provided by the various apertures is evacuated and filled with a mixture of noble gases (He, Ne, Ar or other) at a suitable pressure. The gas mixtures in glow lamps and plasma displays are usually Ne—He or Ar—He. The gas pressure may be anywhere from 10 to 200 torr. The mixture and pressure would be optimised for any particular embodiment.

The cathode may be formed of a material having two essential properties: (i) it must be an electrical conductor; and (ii) it must emit electrons when irradiated by ultra-violet light. Nearly any metal fills the two requirements but, in general, most metals require light of very short wavelengths to emit electrons. (They have high work functions). Typically the wavelengths must be shorter than 3000 A° corresponding to a work function of 4 eV or more. For this particular application a work function of 2.5 or 3.0 eV would be desirable, giving a sensitivity to wavelengths of 4000 A° or less.

Several means may be used to reduce the work function of metallic surfaces. The manufacturing techniques used to make photocathodes for phototubes and photomultipliers may be drawn upon. As examples:

(a) A copper silver nickel or tungsten cathode with a work function of 4.5 to 5 eV can have its work function reduced to 1.4 to 1.7 eV by exposing it to Cesium vapor.

(b) A semi-conductor photo-emissive material such as $CS_3$ Te or $Rb_3$ Te can be formed on a metallic substrate of Copper, Nickel, Chromium, etc.

The plate 6 may, of course, be formed of a material other than glass, e.g., ceramics, or plastics or other electrically insulating material. The front cover may be formed of glass, plastics or any material which is transparent to U.V. rays.

While the back 2 has been described as made of glass or ceramic material, it serves only to hold and give rigidity to the overall assembly. As disclosed the back 2 serves as an insulator. However, if the cathode is made of a strong material and is at ground potential, the back plate 2 could be dispensed with.

In operation, a voltage potential maintained between the cathode and anodes, is applied to conductor 16 which is at a level such that a spontaneous discharge will not be initiated and a selected cell is caused to discharge by illuminating it with a beam of U.V. light, a U.V. laser beam or other appropriate light source, such as indicated at 24. This beam traverses the cover plate 22, goes through the hole in the "doughnut" shaped anode and through the gas filled apertures 8 and strikes the low work function coating on the cathode. The U.V. photons release electrons from the cathode surface which are then accelerated towards the anode. Collisions of accelerated electrons with the gas molecules release more electrons until a luminous discharge is established in the cavity. The resistive element between the anode and the power conductor limits the discharge current. The luminous discharge can be seen through the anode hole. The cell is then in the ON state and will stay ON, until the voltage between the cathode and anode is lowered below the discharge sustaining value. Since all the cells share a common cathode and all the anodes are connected to a common anode, the cells are all extinguished at the same time by removing the power supply to the anode. However, it is envisaged that particular groups (or sub-arrays) of cells may be turned off selectively.

FIG. 2 shows an assembly of cells of the structure shown in FIG. 1. The matrix thus formed may have a common plate 2, cathode 4, plate 6 and front cover 22.

In summary the invention possesses several advantages:

An important point in the device is that addressing is done via a light beam which is directed at the gas cell to be turned ON in the plasma matrix. And it is the energy of the light beam (photons) that initiates the discharge by releasing electrons from the cathode surface.

A technical feature in the device is the low work function coating on the cathode. The work function of the material used for the cathode coating or the whole cathode must be selected to match the energy of the photons of the incident light beam. In general it is easier to release electrons from a surface material when the wavelength of the light is short (high energy photons). This feature provides that once the cells are turned on they will remain on and thus only need to be addressed once by the incident light or laser beam.

In the preferred embodiment given, the outer diameter of the "doughnut" anode is larger and the inner diameter is smaller than the cavity diameter. In this way the discharge takes place between the two electrodes, but there is an open area through which to shine the addressing light beam and to view the luminous discharge. However other electrode configurations could be used, the preferred embodiment shows one of the possible ones only.

Other embodiments falling within the terms of the appended claims will occur to those skilled in the art.

The embodiments of the invention in which an exclusive property or privilege is claimed are defined as follows:

1. A visual display assembly of the type incorporating a matrix of small gas plasma discharge elements, said assembly comprising:

(i) an electrically conductive cathode with a low work function photo-emissive coating thereon, said coating emitting electrons when irradiated with ultra-violet light;

(ii) an insulating plate, in gas sealing arrangement with said coating, said plate having a plurality of cavities formed therein;

(iii) a plurality of anodes on said insulating plate each having an aperture therein axially aligned with an associated cavity;

(iv) a plurality of electrical resistive means on said insulating plate connected one each to said anode for limiting discharge current in said cavities and anodes;

(v) electrical supply means to apply a dc potential to said anodes through the resistive means associated therewith at a level below that required to initiate a discharge;

(vi) a cover member which is transparent to U.V. light and which is in sealing engagement with said insulating plate and enclosing said anodes and said cavities;

(vii) a mixture of noble gases capable of luminous discharge in each of said cavities;

(viii) U.V. illuminating means aligned with selected cavities for directing U.V. light through said cover plate into said selected cavities thereby to strike the said cathode and initiate discharge within said cavities, said dc potential being sufficient to sustain said discharge; and, (ix) switch means to disconnect said dc potential from selected anodes.

2. A visual display according to claim 1 wherein said cover member is quartz.

3. A visual display according to claim 1 wherein said cathode is formed of a material selected from the group consisting of copper, silver, nickel tungsten and chromium.

4. A visual display according to claim 1 wherein said photo-emissive coating is $CS_3T_e$.

5. A visual display according to claim 1 wherein said photo-emissive coating is $Rb_3T_e$.

6. A visual display according to claim 1 further including means communicating with a plurality of said cavities for filling said cavities with said mixture of noble gases.

7. A visual display according to claim 1 further including a backing or mounting plate upon which the cathode, insulating plate and cover are mounted in order.

8. A visual display according to claim 7 wherein said backing or mounting plate is an electrical insulator.

9. A visual display according to claim 7 wherein said backing or mounting plate is glass.

10. A visual display according to claim 7 wherein said backing or mounting plate is ceramic.

11. A visual display according to claim 1 wherein said gases are selected from the group consisting of Ne, He and Ar.

12. A visual display assembly according to claim 1 wherein said electrical supply means includes a conductor on said insulating plate connecting said dc potential to said plurality of resistive means.

13. A visual display according to claim 12 wherein said anodes, resistances and conductor comprise respective layers deposited on the insulated plate.

* * * * *